United States Patent
Sato et al.

(10) Patent No.: US 9,875,880 B2
(45) Date of Patent: *Jan. 23, 2018

(54) SLIDE PART AND SURFACE PROCESSING METHOD OF THE SAME

(71) Applicant: JAPAN AVIATION ELECTRONICS INDUSTRY, LIMITED, Shibuya-ku, Tokyo (JP)

(72) Inventors: Akinobu Sato, Tokyo (JP); Akiko Suzuki, Tokyo (JP); Takeshi Kawano, Tokyo (JP)

(73) Assignee: JAPAN AVIATION ELECTRONICS INDUSTRY, LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/464,858

(22) Filed: Mar. 21, 2017

(65) Prior Publication Data

US 2017/0194127 A1    Jul. 6, 2017

Related U.S. Application Data (63) Continuation of application No. 13/008,639, filed on Jan. 18, 2011, now Pat. No. 9,636,737.

(30) Foreign Application Priority Data

Feb. 1, 2010    (JP) ................ 2010-020554

(51) Int. Cl.
  *C23F 4/00*     (2006.01)
  *H01J 37/305*   (2006.01)
  (Continued)

(52) U.S. Cl.
  CPC .......... *H01J 37/3056* (2013.01); *B21D 37/18* (2013.01); *B32B 3/30* (2013.01);
  (Continued)

(58) Field of Classification Search
  CPC .......... H01J 37/3056; B21D 37/18; C23F 4/00
  See application file for complete search history.

(56) References Cited

U.S. PATENT DOCUMENTS

| 5,879,819 A | 3/1999 | Taniguchi et al. |
| 2002/0090155 A1 | 7/2002 | Ushijima et al. |

(Continued)

FOREIGN PATENT DOCUMENTS

| EP | 2079104 | 7/2009 |
| JP | H07-018403 | 1/1995 |

(Continued)

OTHER PUBLICATIONS

Taiwanese office action dated Jul. 3, 2013.
(Continued)

*Primary Examiner* — Laura A Auer
(74) *Attorney, Agent, or Firm* — Greenblum & Bernstein, P.L.C.

(57) ABSTRACT

A slide part has a surface structure in which there are at least two periodic structures among a first periodic structure with a period of 10 nm to 100 nm inclusive and a depth of 5 nm to 50 nm inclusive, a second periodic structure with a period of 100 nm to 1000 nm inclusive and a depth of 20 nm to 500 nm inclusive, and a third periodic structure with a period of 1000 nm to 10000 nm inclusive and a depth of 100 nm to 3000 nm inclusive, in which one of the at least two periodic structures is formed on the other periodic structure.

4 Claims, 12 Drawing Sheets

(51) Int. Cl.
*B32B 3/30* (2006.01)
*B21D 37/18* (2006.01)
*H01J 37/317* (2006.01)

(52) U.S. Cl.
CPC .............. *C23F 4/00* (2013.01); *H01J 37/317* (2013.01); *Y10T 428/12389* (2015.01); *Y10T 428/24355* (2015.01); *Y10T 428/24446* (2015.01); *Y10T 428/24479* (2015.01)

(56) References Cited

U.S. PATENT DOCUMENTS

2009/0092796 A1   4/2009   Ishida et al.
2009/0317654 A1   12/2009   Saruwatari et al.

FOREIGN PATENT DOCUMENTS

JP   2001-247948   9/2001
JP   2005-144528   6/2005
TW   428036   4/2001

OTHER PUBLICATIONS

Office Action issued in Taiwanese family member Patent Appl. No. 103100194, dated Jun. 26, 2016, along with an English translation thereof.
Seiji Kataoka, "Tribology of Press Working," Nikkan Kogyo Shinbun, Ltd., Jan. 21, 2002, pp. 33-46.
Office Action dated Mar. 23, 2012 by the Patent Office of the people's Republic of China for family member foreign patent application CN 2011 10022711.5, along with an English translation thereof.

PRIOR ART

| | GCIB RADIATION CONDITION | | | FIRST PERIODIC STRUCTURE | | SECOND PERIODIC STRUCTURE | | THIRD PERIODIC STRUCTURE | | PRESENCE OR ABSENCE OF ADHESION | | | | | |
|---|---|---|---|---|---|---|---|---|---|---|---|---|---|---|---|
| | AccV | Dose | IrrA | Prd | Dpth | Prd | Dpth | Prd | Dpth | S50 | S100 | S200 | S400 | S1000 |
| EE1 | 20 | 3.0E+18 | 60 | 20~70 | 10 | 200~500 | 75 | 2000~3000 | 320 | × | × | × | × | × |
| EE2 | 20 | 3.0E+18 | 5 | 10~23 | 5 | 100~230 | 20 | - | - | × | ○ | ○ | ○ | ○ |
| EE3 | 20 | 3.0E+18 | 10 | 10~25 | 6 | 100~320 | 31 | - | - | × | × | ○ | ○ | ○ |
| EE4 | 20 | 3.0E+18 | 15 | 17~32 | 8 | 100~350 | 43 | - | - | × | × | ○ | ○ | ○ |
| EE5 | 20 | 3.0E+18 | 20 | 20~53 | 8 | 150~410 | 51 | - | - | × | × | ○ | ○ | ○ |
| EE6 | 20 | 3.0E+18 | 25 | 22~55 | 8 | 170~420 | 55 | - | - | × | × | ○ | ○ | ○ |
| EE7 | 20 | 3.0E+18 | 30 | 23~60 | 8 | 190~410 | 62 | 1000~2200 | 100 | × | × | × | × | ○ |
| EE8 | 20 | 3.0E+18 | 35 | 21~64 | 8 | 200~410 | 65 | 1000~2300 | 140 | × | × | × | × | ○ |
| EE9 | 20 | 3.0E+18 | 40 | 24~65 | 9 | 220~450 | 69 | 1400~2500 | 210 | × | × | × | × | ○ |
| EE10 | 20 | 3.0E+18 | 45 | 25~66 | 9 | 220~460 | 71 | 1500~2700 | 240 | × | × | × | × | ○ |

FIG. 10B

| | GCIB RADIATION CONDITION | | | FIRST PERIODIC STRUCTURE | | SECOND PERIODIC STRUCTURE | | THIRD PERIODIC STRUCTURE | | PRESENCE OR ABSENCE OF ADHESION | | | | | |
|---|---|---|---|---|---|---|---|---|---|---|---|---|---|---|---|
| | AccV | Dose | IrrA | Prd | Dpth | Prd | Dpth | Prd | Dpth | S50 | S100 | S200 | S400 | S1000 |
| EE11 | 20 | 3.0E+18 | 50 | 25~68 | 9 | 230~470 | 75 | 1100~2500 | 280 | × | × | × | × | ○ |
| EE12 | 20 | 3.0E+18 | 55 | 23~70 | 10 | 250~500 | 77 | 1500~2600 | 320 | × | × | × | × | × |
| EE13 | 20 | 3.0E+18 | 65 | 31~83 | 22 | 300~890 | 153 | 2800~7600 | 470 | × | × | × | × | × |
| EE14 | 20 | 3.0E+18 | 70 | 39~89 | 48 | 420~960 | 310 | 3300~8600 | 1200 | × | × | × | × | × |
| EE15 | 20 | 3.0E+18 | 75 | 67~100 | 50 | 520~1000 | 500 | 3600~9800 | 3000 | × | × | × | × | × |
| EE16 | 20 | 3.0E+18 | 80 | 20~52 | 15 | - | - | 4500~10000 | 1800 | × | × | × | ○ | ○ |
| EE17 | 20 | 3.0E+18 | 85 | 19~51 | 14 | - | - | 4800~10000 | 650 | × | × | × | ○ | ○ |
| EE18 | 15 | 3.0E+18 | 60 | 20~53 | 10 | 200~430 | 70 | 1700~3200 | 320 | × | × | × | × | × |
| EE19 | 10 | 3.0E+18 | 60 | 15~43 | 10 | 150~360 | 63 | 1500~2900 | 280 | × | × | × | × | × |
| EE20 | 20 | 1.0E+19 | 60 | 30~84 | 21 | 320~560 | 145 | 2700~4800 | 540 | × | × | × | × | × |

FIG. 10C

| | GCIB RADIATION CONDITION | | | FIRST PERIODIC STRUCTURE | | SECOND PERIODIC STRUCTURE | | THIRD PERIODIC STRUCTURE | | PRESENCE OR ABSENCE OF ADHESION | | | | | |
|---|---|---|---|---|---|---|---|---|---|---|---|---|---|---|---|
| | AccV | Dose | IrrA | Prd | Dpth | Prd | Dpth | Prd | Dpth | S50 | S100 | S200 | S400 | S1000 |
| EE21 | 20 | 1.0E+20 | 60 | 45~100 | 50 | 440~1000 | 287 | 3100~9300 | 1200 | × | × | × | × | × |
| EE22 | 20 | 3.0E+18 | 60 | 18~67 | 9 | 240~520 | 72 | 2900~4300 | 330 | × | × | × | × | × |
| EE23 | 20 | 3.0E+18 | 60 | 20~72 | 12 | 200~570 | 71 | 2300~3700 | 340 | × | × | × | × | × |
| EE24 | 20 | 3.0E+18 | 60 | 20~74 | 11 | 170~480 | 75 | 2100~3200 | 320 | × | × | × | × | × |
| EE25 | - | - | - | - | - | - | - | - | - | ○ | ○ | ○ | ○ | ○ |
| CE1 | 20 | 3.0E+18 | 0 | 10~20 | 5 | 500 | 100 | 3000 | 1000 | ○ | ○ | ○ | ○ | ○ |
| CE2 | - | - | - | - | - | 500 | 100 | - | - | × | ○ | ○ | ○ | ○ |
| CE3 | - | - | - | - | - | - | - | 3000 | 1000 | × | ○ | ○ | ○ | ○ |
| CE4 | 20 | 3.0E+18 | 60 | 20~70 | 10 | 200~500 | 75 | 2000~3000 | 320 | × | ○ | ○ | ○ | ○ |
| CE5 | 20 | 3.0E+18 | 60 | 20~70 | 10 | 200~500 | 75 | 2000~3000 | 320 | × | × | ○ | ○ | ○ |

SLIDE PART AND SURFACE PROCESSING METHOD OF THE SAME

CROSS REFERENCE TO RELATED APPLICATIONS

This is a continuation application of U.S. patent application Ser. No. 13/008,639, filed Jan. 18, 2011, which claims the benefit of Japanese Patent Application No. 2010-020554, filed on Feb. 1, 2010. The entire disclosure of each of the above-identified applications, including the specification, drawings, and claims, is incorporated herein by reference in its entirety.

TECHNICAL FIELD

The present invention relates to a slide part such as a mold for precisely forming fine connectors or other electronic devices and a method of processing the surface of the slide part.

BACKGROUND ART

Many slide parts such as drills or other tools, molds, and engine parts are industrially used. For example, in press mold working, the lubrication mechanism on the friction interface during processing greatly affects the quality characteristics such as reduction of burrs of a press molded product and the durability of the mold of a punch or die. This lubrication mechanism includes an injection mechanism, which injects a lubricant into the friction interface, and a friction reduction mechanism, which uses a lubricant to reduce friction on the friction interface.

One injection mechanism uses projections and depressions on the material surface to inject the lubricant. There are various sizes of projections and depressions (surface roughness) on the surface of a workpiece or mold. The lubricant applied to the workpiece or mold before processing is stored in the depressions on the surface (storage effect). If there is no space to which the lubricant escapes when the mold and the workpiece make contact each other, the lubricant is encapsulated in the depressions and the lubricant is supplied to the friction interface with this state maintained. The depressions containing the lubricant are referred to as micro pools or lubricant pools in plastic working. This type of injection mechanism is expected in all types of plastic working.

When the surface roughness of the workpiece or mold is increased in advance by acid corrosion, shot peening, or sand blast in order to take advantage of this storage effect, the lubricant is easily injected, friction is reduced by the friction reduction mechanism, and galling or welding can be prevented. With the progress of pressure working, a high hydrostatic fluid pressure applies to the lubricant in micro pools and supports part of the pressure of the processed surface. In this state, the contact ratio between the workpiece and the mold is prevented from increasing (friction reduction mechanism). The technical information related to this is described in non-patent literature 1 ("Tribology of Press Working", edited by Japan Metal Stamping Association, written by Seiji Kataoka, issued by the Nikkan Kogyo Shinbun, Ltd.).

The prior art for forming micro pools on the surface of a metal member is disclosed by, for example, patent literature 1 (Japanese Patent Application Laid-Open No. 2005-144528), patent literature 2 (Japanese Patent Application Laid-Open No. 7-18403), and patent literature 3 (Japanese Patent Application Laid-Open No. 2001-247948).

Patent literature 1 discloses a mold for which lubricant pools with a size of approximately 3 μm×3 μm×1.5 μm are formed on a molding die surface of the mold surface that makes contact with the workpiece. When forming work is performed with a lubricant present between the mold and the workpiece, the lubricant is stored in the lubricant pools. Accordingly, the workpiece is formed with high lubricity kept between the mold die surface of the mold and the surface of the workpiece.

Patent literature 2 discloses a metal member in which micro pools with a depth of 2 μm or more, a density of 200 units/mm$^2$ to 8200 units/mm$^2$, and an area ratio of 10% to 70% are formed by heat treatment of alloy material.

Patent literature 3 discloses a metal member having grooves with a depth of 0.1 μm to 5.0 μm inclusive at an area ratio of 0.1% to 30.0% inclusive on the surface and particle projections with a diameter of 5 nm to 500 nm inclusive, viewed from the surface, a height of 5 nm to 500 nm inclusive at an area ratio of 30% or more (including 100%) in the surface other than the above.

The prior arts improve the holding characteristics of a lubricant by forming micro pools on the surface of the metal member. If this metal member is used repeatedly for processing, however, adhesion of the workpiece to the surface of the metal member occurs, thereby causing wear of the metal member and dimensional error of a molded product.

SUMMARY OF THE INVENTION

The present invention addresses these problems with the object of providing a slide part and a method of processing the surface of the slide part that make adhesion of the workpiece to the surface of the slide part difficult.

A first aspect of the present invention is a slide part that has a surface structure in which there are at least two periodic structures among a first periodic structure with a period of 10 nm to 100 nm inclusive and a depth of 5 nm to 50 nm inclusive, a second periodic structure with a period of 100 nm to 1000 nm inclusive and a depth of 20 nm to 500 nm inclusive, and a third periodic structure with a period of 1000 nm to 10000 nm inclusive and a depth of 100 nm to 3000 nm inclusive, in which one of the at least two periodic structures is formed on the other periodic structure.

A second aspect of the present invention is the slide part according to the first aspect, in which at least one of the second periodic structure and the third periodic structure is a ripple structure.

A third aspect of the present invention is the slide part according to the second aspect, in which the ripple structure of the at least one of the second periodic structure and the third periodic structure is formed in a direction orthogonal to a slide direction of the slide part.

A fourth aspect of the present invention is the slide part according to any one of the first to third aspects, in which the surface structure is formed at least on an edge of the slide part.

A fifth aspect of the present invention is a method of processing a surface of a slide part using a gas cluster ion beam, in which the method has a step of radiating the gas cluster ion beam from a direction parallel to a slide direction of the slide part.

A sixth aspect of the present invention is the method of processing the surface of the slide part according to the fifth aspect, in which an angle formed by the gas cluster ion beam to be radiated and a line normal to the surface of the slide part ranges from 30 degrees to 75 degrees inclusive.

EFFECTS OF THE INVENTION

According to the present invention, the slide part has the surface structure including at least two periodic structures among the second periodic structure with a size similar to that of adhesion, the third periodic structure with a size larger than that of adhesion, and the first periodic structure with a size smaller than that of adhesion, in which one of the at least two periodic structures is formed on the other structure, so adhesion to the slide part is unlikely to occur. In addition, the life and maintenance period of the slide part itself can be extended.

DETAILED DESCRIPTION OF THE EMBODIMENTS

As described above, if small projections and depressions are formed on the surface of a slide part in advance, the lubricant applied to the slide part or its counterpart before processing is stored in the depressions (micro pools) on the surface. If there is no space to which the lubricant escapes when the slide part and its counterpart make contact each other, the lubricant is encapsulated in the micro pools and supplied to the friction interface with this state maintained.

Even when a lubricant injection mechanism supplies a large amount of lubricant to the friction interface, however, a continuous fluid lubrication film is rarely formed over the entire friction interface. This is particularly true for, for example, press working. There are two types of contact states on the friction interface: a solid/solid contact state, in which the slide part and its counterpart make contact each other, and a solid/liquid contact state, in which the slide part and the lubricant in micro pools make contact each other. In the solid/solid contact state, boundary lubrication is dominant and metallic bonds also occur at the friction interface. On the other hand, in the solid/liquid contact state, a high hydrostatic fluid pressure is applied to the lubricant in micro pools and a state similar to fluid lubrication is achieved.

Figure 1:
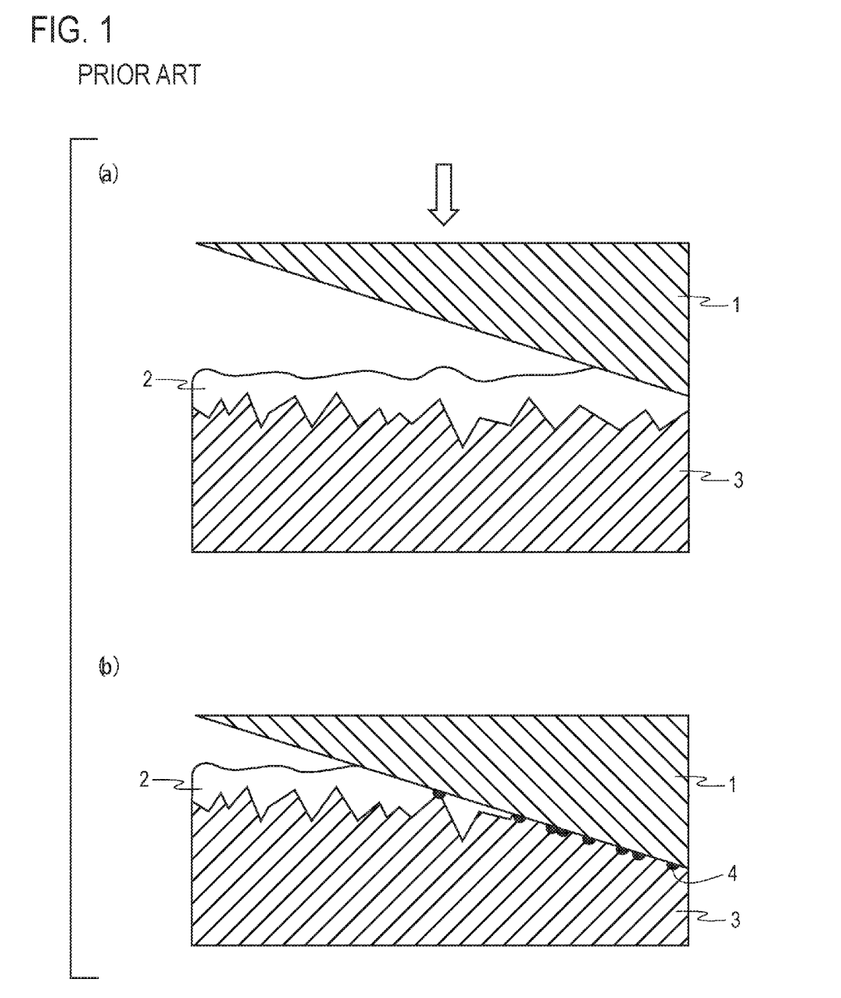
FIG. 1 schematically shows the occurrence of adhesion in press working (the prior art) even using a mold having a very flat surface, specifically, an illustration (a) in FIG. 1 shows the state before the press working and an illustration (b) in FIG. 1 shows the state after the press working.
Figure 2:
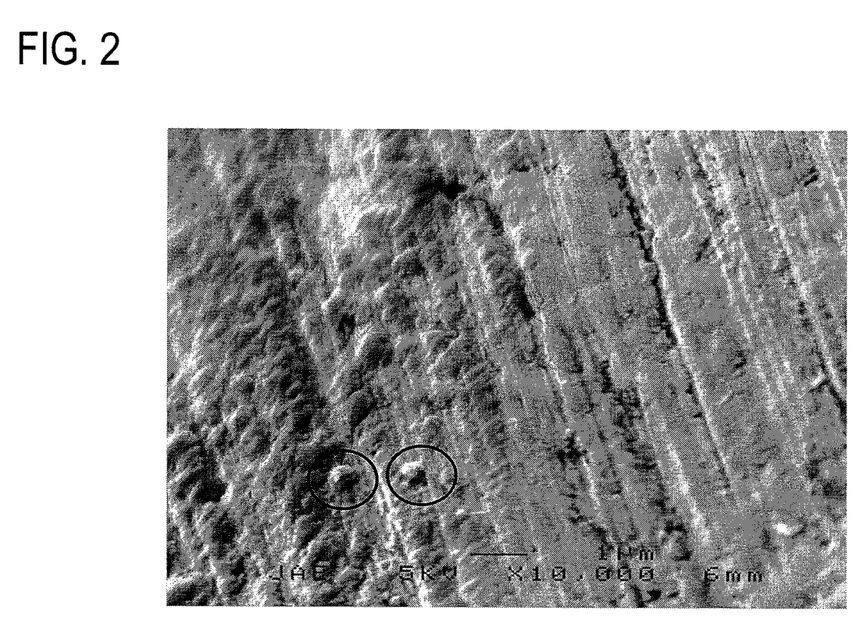
FIG. 2 shows transfer particles observed by a scanning electron microscope.

For example, if a mold, which is a slide part 1, has a very flat surface, since a lubricant 2 escapes from the friction interface between the mold and a workpiece 3 as shown in FIG. 1, the workpiece 3 readily adheres to the mold. Reference numeral 4 indicates an adhesive portion (only one adhesive portion is indicated by the reference numeral to eliminate complexity of the drawing). FIG. 2 shows the adhesion of the workpiece 3 to the mold observed by a scanning electron microscope. Transfer particles (enclosed by the circles in the figure) are observed which are formed because parts of workpiece are left on the surface of the mold when the adhesive part 4 of the workpiece 3 and the mold is separated. It is found from the observation that many transfer particles have a diameter of hundreds of nanometers to one micrometer.

Figure 3:
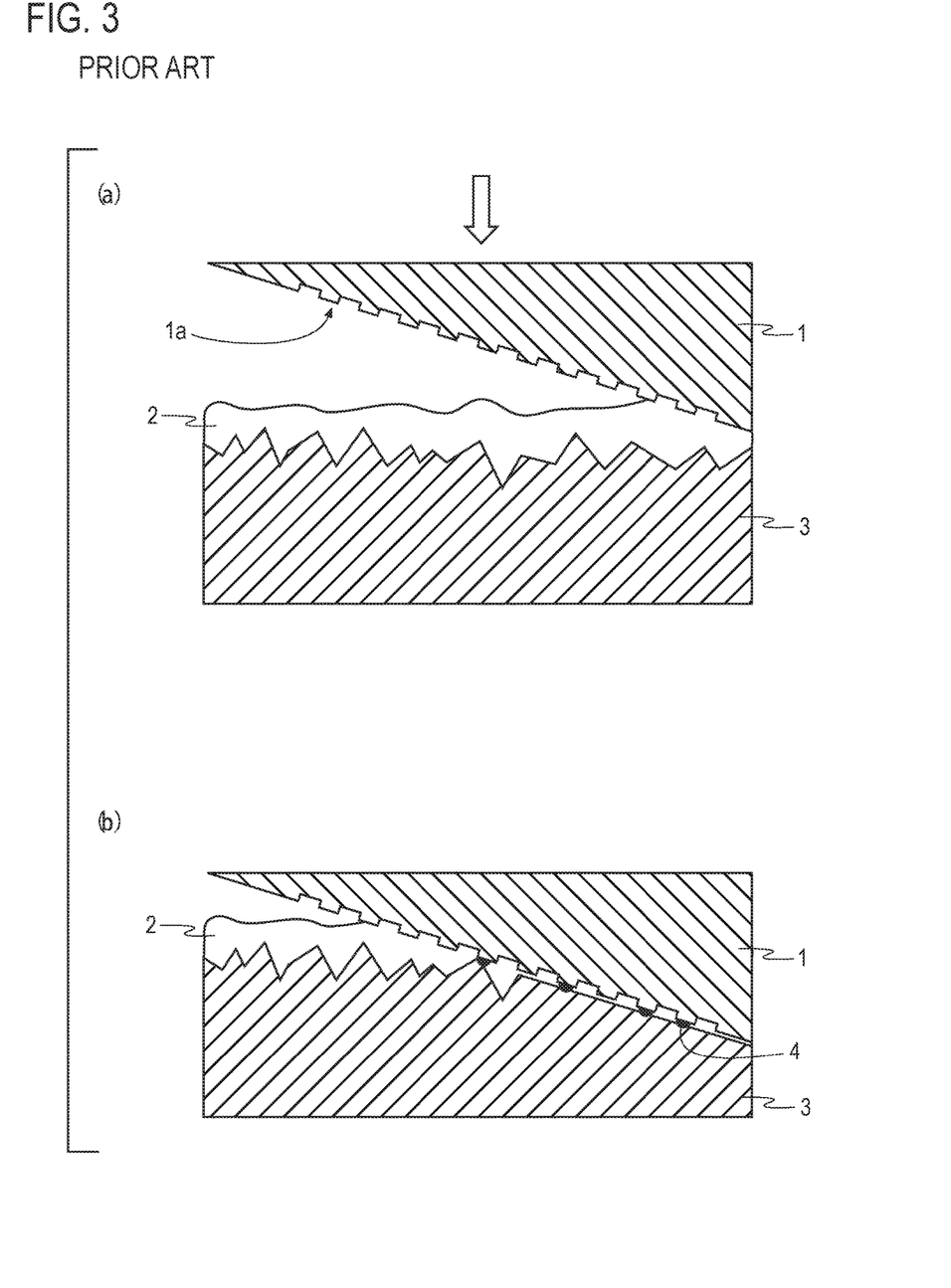
FIG. 3 schematically shows the occurrence of adhesion in press working (the prior art) using a mold with periodic projections and depressions on its surface, specifically, an illustration (a) in FIG. 3 shows the state before the press working and an illustration (b) in FIG. 3 shows the state after the press working.
Figure 4:
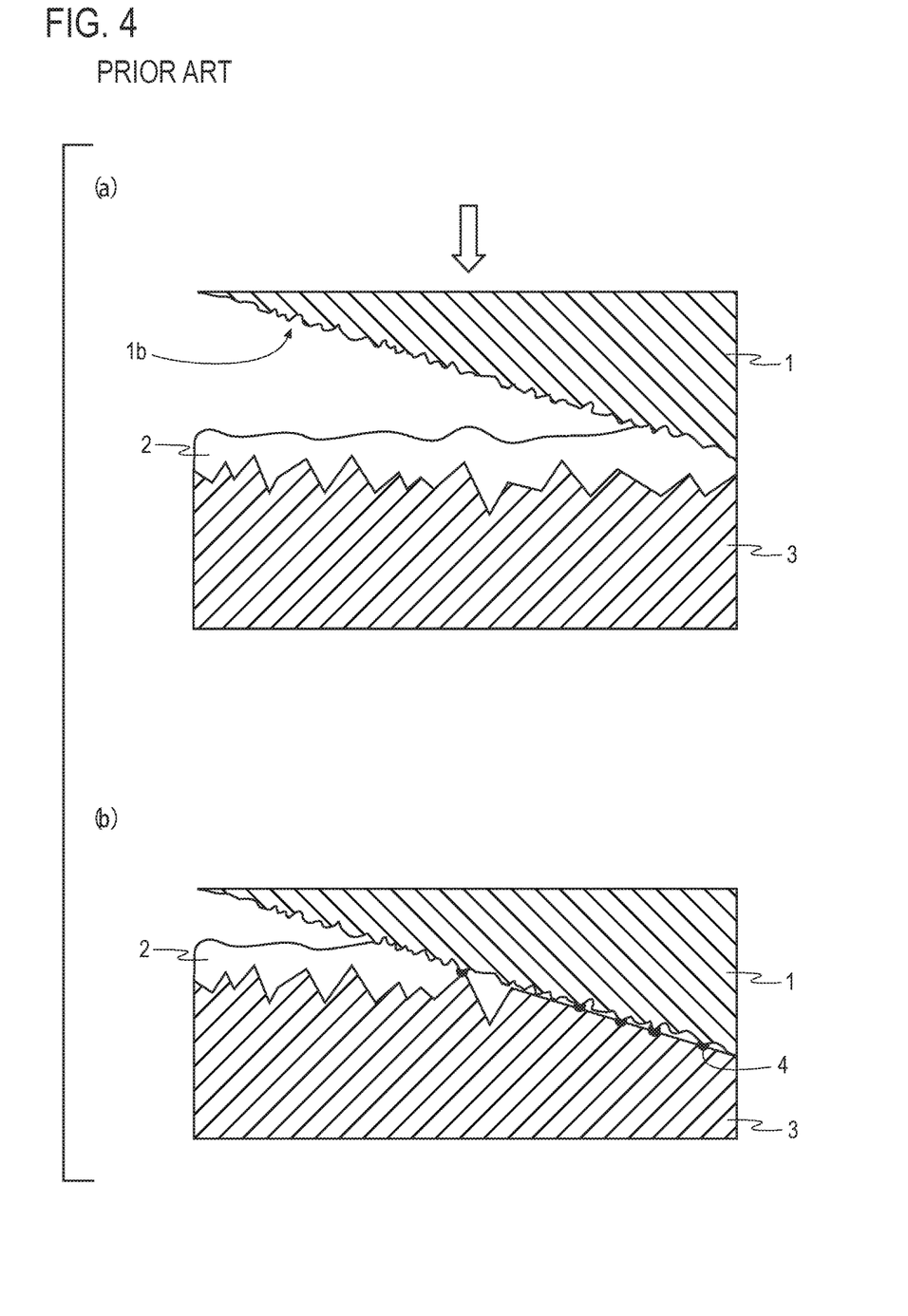
FIG. 4 schematically shows the occurrence of adhesion in press working (the prior art) using a mold with irregular projections and depressions on its surface, specifically, an illustration (a) in FIG. 4 shows the state before the press working and an illustration (b) in FIG. 4 shows the state after the press working.

When periodic projections and depressions 1a are formed on the surface of the mold as in the prior art, the solid/solid contact state is relieved and adhesion of the workpiece 3 is reduced because the lubricant 2 is supplied to the friction interface as shown in FIG. 3. In addition, when irregular projections and depressions 1b are formed on the surface of the mold as shown in FIG. 4, adhesion of the workpiece 3 is also reduced. In such conditions, however, it is impossible to prevent adhesion to the workpiece 3. This is because boundary lubrication is dominant in the solid/solid contact state as described above.

There are projections and depressions, flaws, crystal grain boundaries, accumulated processing strain, etc. on the surface of the workpiece 3. Friction between these uneven portions (e.g. high projections) and the surface of the mold causes adhesion with a size of approximately 100 nm to 1 µm. The inventors found that a significantly larger amount of lubricant could be supplied to the friction interface as compared with the prior art by forming at least two types of micro pools on the surface of the slide part 1 among micro pools with a diameter similar to the diameter (approximately from 100 nm to 1 µm) of the adhesion, micro pools with a period (from 1 µm to 10 µm) larger than the size of the adhesion, and micro pools with a period (from 10 nm to 100 nm) smaller than the size of the adhesion. Specifically, the slide part according to the present invention has a surface structure including at least two periodic structures among a first periodic structure with a period of from 10 nm to 100 nm inclusive and a depth of from 5 nm to 50 nm inclusive, a second periodic structure with a period of from 100 nm to 1000 nm inclusive and a depth of from 20 nm to 500 nm inclusive, and a third periodic structure with a period of from 1000 nm to 10000 nm inclusive and a depth of from 100 nm to 3000 nm inclusive, in which one of the at least two periodic structures is formed on the other periodic structure.

Figure 5:
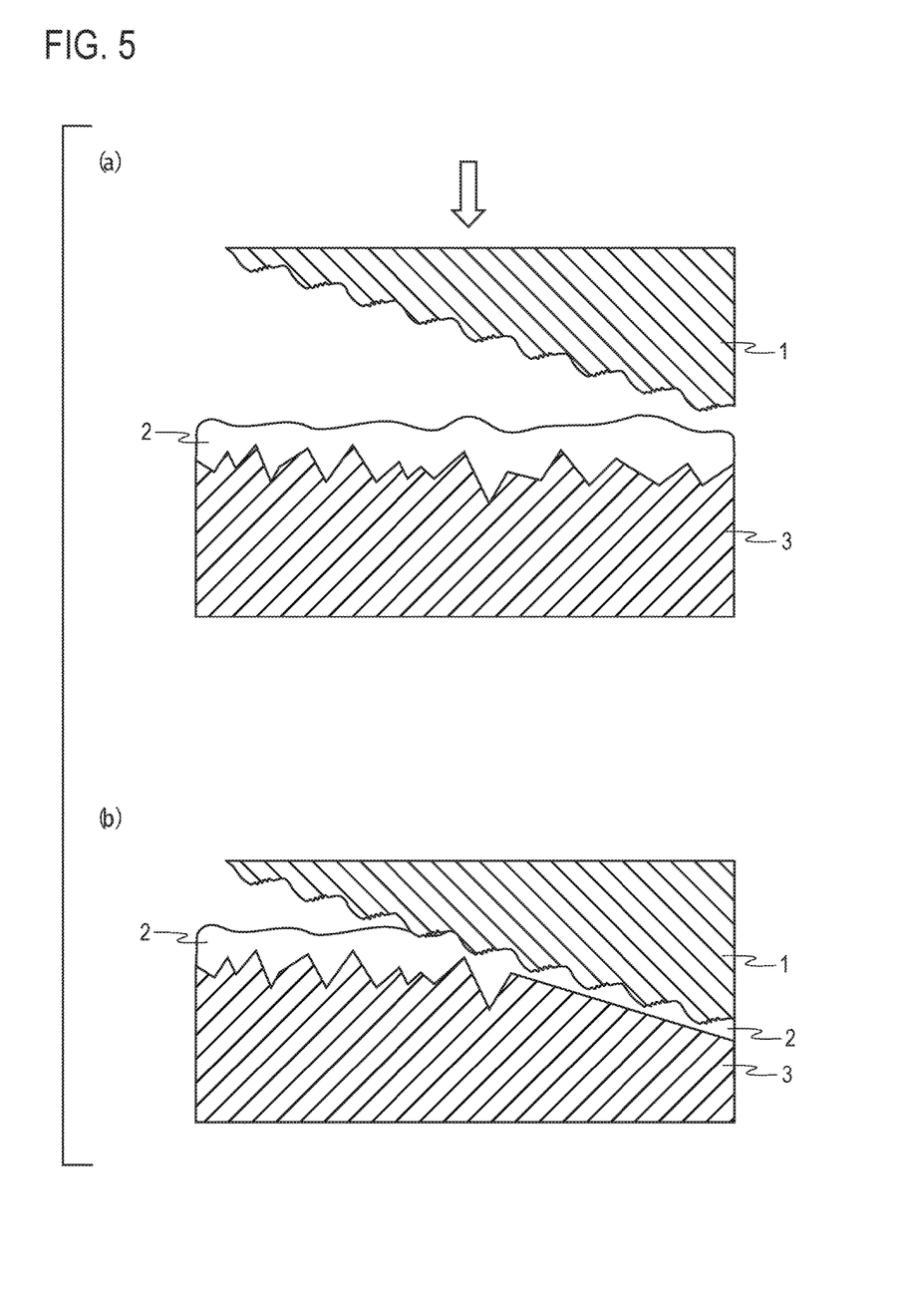
FIG. 5 shows that no adhesion occurs in press working using the slide part (mold) according to the present invention, specifically, an illustration (a) in FIG. 5 shows the state before the press working and an illustration (b) in FIG. 5 shows the state after the press working.

If the slide part 1 according to the present invention is used for press working or other processing, a continuous fluid lubrication film is formed all over the friction interface, thereby preventing adhesion of the workpiece 3 (see FIG. 5). The reason why fluid lubrication can be achieved by micro pools (with a period of 1 µm to 10 µm) having a larger diameter than that of a transfer particle is assumed to be that the lubricant is supplied to the friction interface in multiple stages through wedge effects in the order of a micrometer (see non-patent literature 1 for wedge effects). Accordingly, the surface structure of the slide part should be wedge-shaped. On the other hand, a mechanism for using micro pools (with a period of 10 nm to 100 nm) having a smaller diameter than that of a transfer particle to relieve the contact pressure of a micro solid contact caused in the liquid lubrication state at the friction interface is considered. Such effects can suppress the adhesion of the workpiece 3 to the surface of the slide part 1.

The inventors also found that the surface structure could be formed on the slide part by radiating a gas cluster ion beam to the slide part. Processing by a gas cluster ion beam is a beam process, so a gas cluster ion beam can be radiated to a part of the slide part, which is, for example, an edge of the slide part. A fine ripple structure can be formed on the surface of the slide part by radiating a gas cluster ion beam so that the angle formed by the gas cluster ion bean and a line normal to the surface of the slide part becomes typically 30 degrees to 75 degrees inclusive. It is preferable that the lines of the ripple structure extend in a direction orthogonal to the slide direction for storing the lubricant in micro pools.

The gas cluster ion beam apparatus disclosed by, for example, Japanese Patent No. 3994111 can be used to form the above surface structure on the surface of the slide part. Clusters are generated by injecting a source gas from a nozzle to a cluster generating chamber kept under vacuum to aggregate gas molecules. The clusters are lead to an ionization chamber as a gas cluster beam through a skimmer. In the ionization chamber, an ionizer radiates an electron beam such as thermal electrons to neutral clusters to ionize them. The ionized gas cluster beam is accelerated by an accelerating electrode. The incident gas cluster ion beam is adjusted by an aperture to have a predetermined beam diameter and radiated to the slide part. When, for example, the surface of the slide part made of electrical insulator is flattened, gas cluster ion may be neutralized in advance by electrons. It is possible to control the angle at which the gas cluster ion beam is radiated to the surface of the slide part by slanting the slide part. In addition, the gas cluster ion beam can be radiated in any direction by moving the slide part vertically or horizontally or rotating the slide part using an X-Y stage or rotation mechanism.

There is a mechanism by which a hydrostatic fluid pressure is generated in the water stored in micro pools because moisture in the normal atmosphere adsorbed on the surfaces of the slide part or the counterpart functions as a lubricant and generates a hydraulic pressure even though a lubricant that causes a hydrostatic fluid pressure to generate in micro pools is not applied to the slide part or the counterpart. Accordingly, application of a lubricant is not necessarily be required in the present invention.

Examples according to the present invention and comparative examples for confirming the effects of the examples will be described below.

EXAMPLE 1

Figure 6:
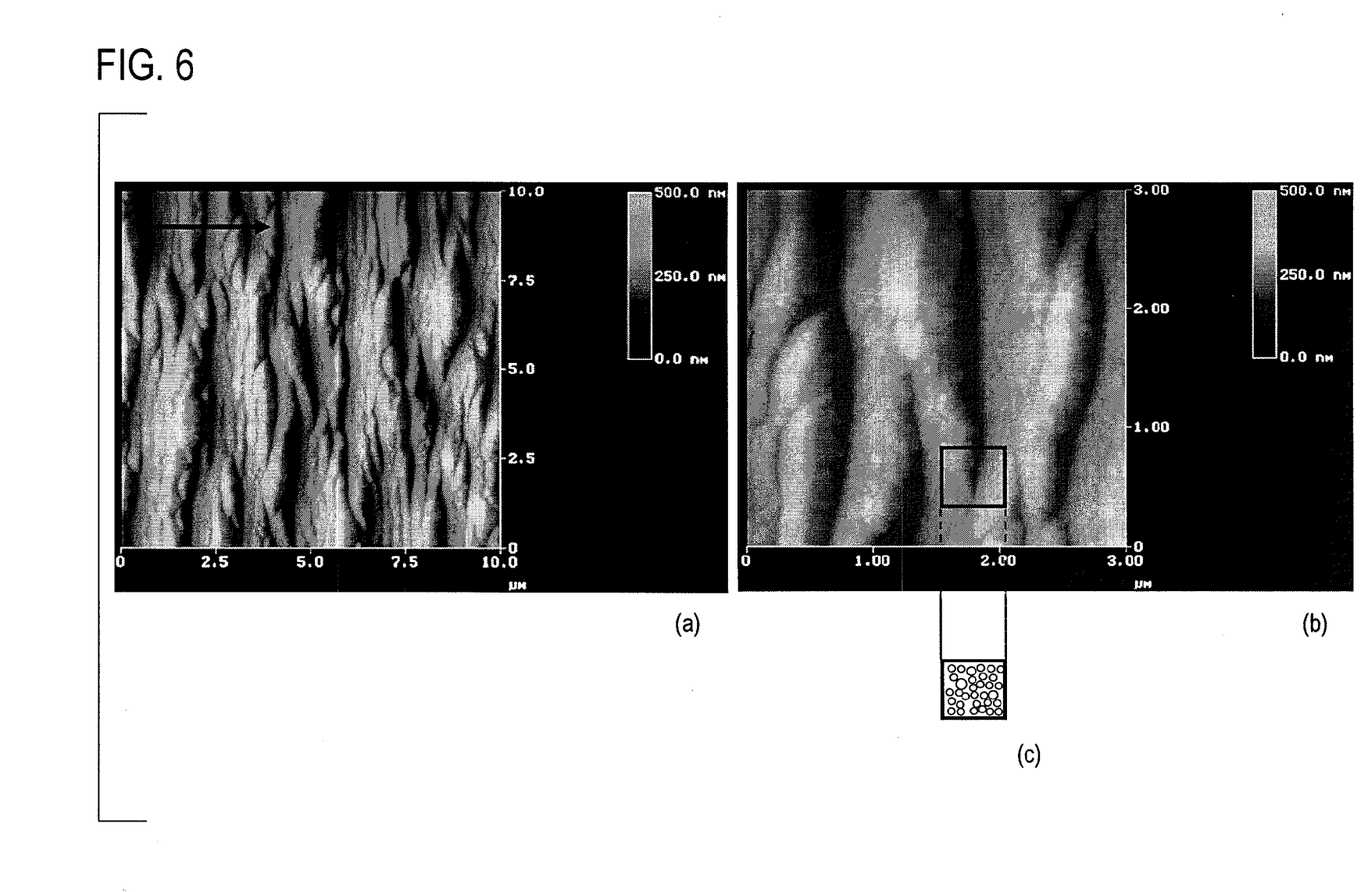
FIG. 6 shows a set of the images observed by an atomic force microscope and a schematic view, specifically, an image (a) in FIG. 6 shows an observational result of the shapes of the first to third periodic structures observed by the atomic force microscope; an image (b) in FIG. 6 shows an observational result of the shapes of the first and second periodic structures observed by the atomic force microscope, an image (c) in FIG. 6 is a schematic view of the section enclosed by the square in the image (b) in FIG. 6.
Figure 7:
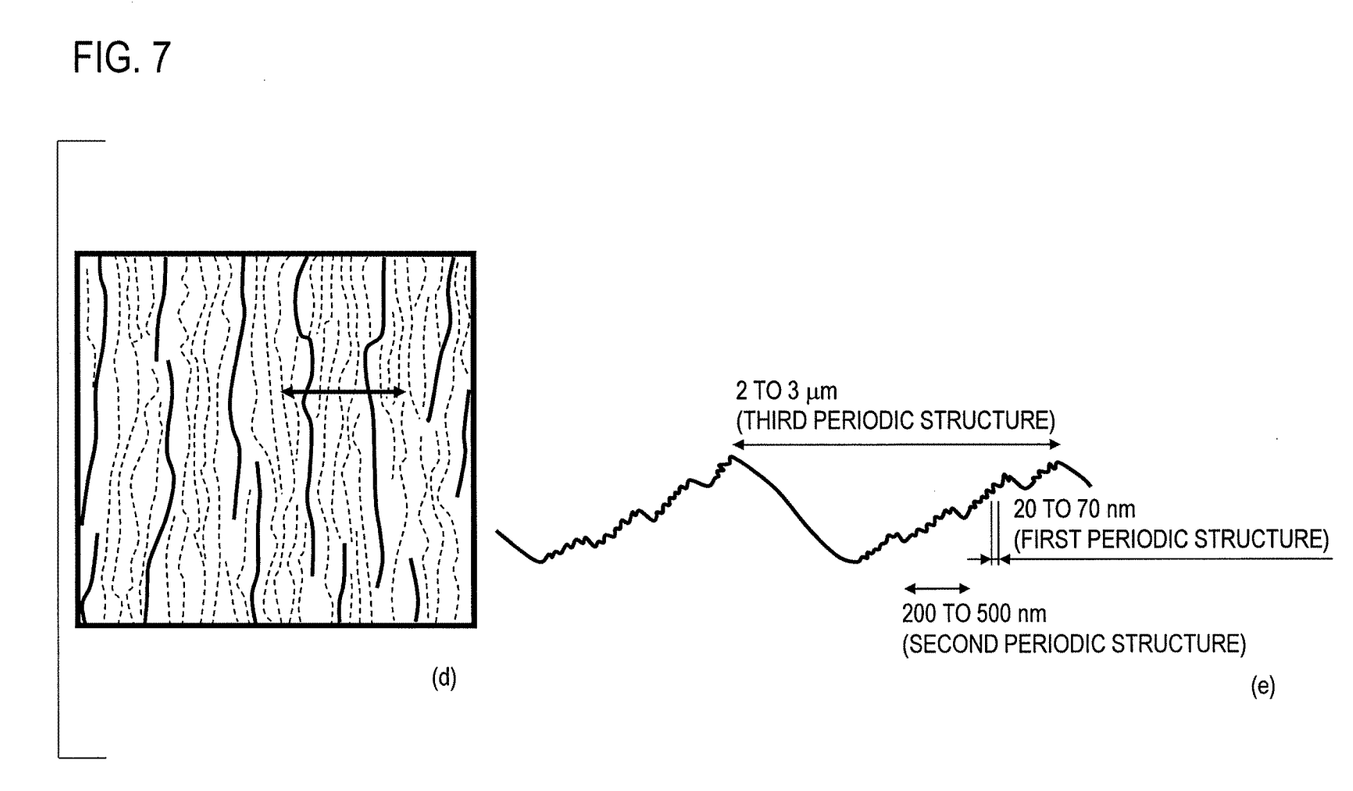
FIG. 7 shows schematic views of the periodic structures, specifically, an illustration (d) in FIG. 7 is a schematic view of the first to third periodic structures in FIG. 6(a), and an illustration (e) in FIG. 7 is an enlarged view of the part indicated by the double-headed arrow in the illustration (d) in FIG. 7 and schematically shows the surface structure in which the first, second and third periodic structures are combined.
Figure 8:
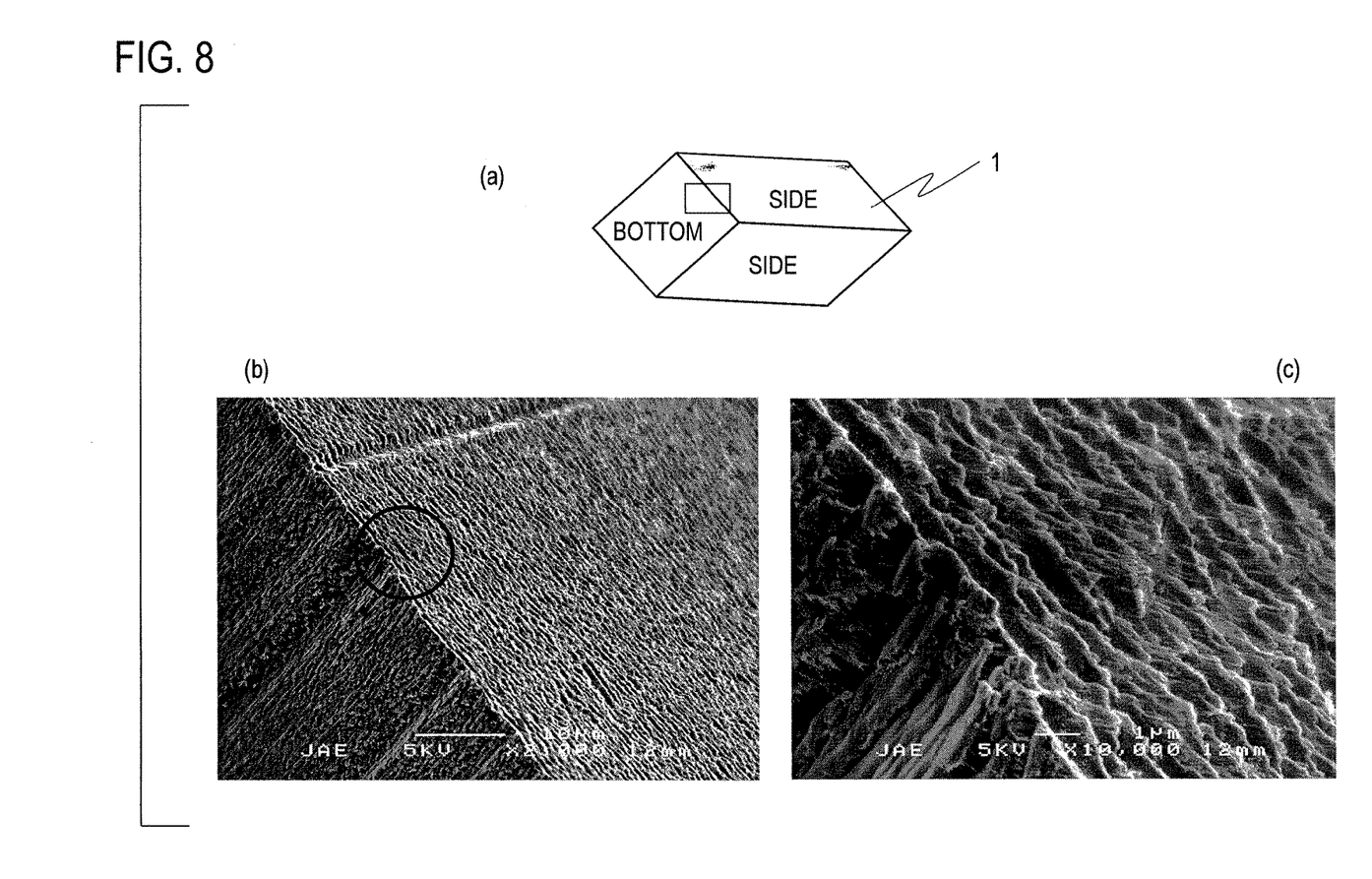
FIG. 8 shows a schematic view of the mold and images observed by the scanning electron microscope, specifically, an illustration (a) in FIG. 8 is a schematic view of a punch mold, an image (b) in FIG. 8 shows an observational result of the section enclosed by the square in the illustration (a) in FIG. 8, and an illustration (c) in FIG. 8 is an enlarged view of the section enclosed by the circle in the image (b) in FIG. 8.

A punch mold, which is an example of the slide part 1, was created by grinding work. The punch mold is made of ultrahard material (Japanese Industrial Standards V20). The punch mold has a rectangular (1 mm×2 mm) bottom. To a side of the punch mold, a gas cluster ion beam was radiated in parallel with a slide direction of the punch mold with respect to a workpiece 3 so that the angle formed by the normal line of the surface of the punch mold and the gas cluster ion beam was 60 degrees. The slide direction is indicated by the arrows in FIGS. 6(a) and 9(a) and 9(c). An argon gas was used as the source gas. The acceleration voltage was 20 kV and the radiation dose amount was $3 \times 10^{18}$ ions/cm$^2$. Upon completion of radiation, the punch mold was observed by a scanning electron microscope and atomic force microscope. Periodic structures were observed on the side and the edge of the punch mold. The shapes of the periodic structures observed by the atomic force microscope are shown in FIGS. 6 and 7. The periodic structures observed by the scanning electron microscope are shown in FIG. 8. Each of the periodic structures had a ripple structure in which lines extend in a direction orthogonal to the slide direction. In detailed observation, as shown in FIG. 7(e), three types of periodic structures were combined. The first periodic structure had a period of 20 nm to 70 nm and an average depth of 10 nm, the second periodic structure had a period of 200 nm to 500 nm and an average depth of 75 nm, and the third periodic structure had a period of 2000 nm to 3000 nm and an average depth of 320 nm. In addition, of these periodic structures, the first periodic structure had a particle structure (see FIG. 6(c)) and the second and third periodic structures had a ripple structure in which lines extend in a direction orthogonal to the slide direction (see FIG. 6(b) for the second periodic structure or FIG. 6(a) for the third periodic structure.).

Figure 9:
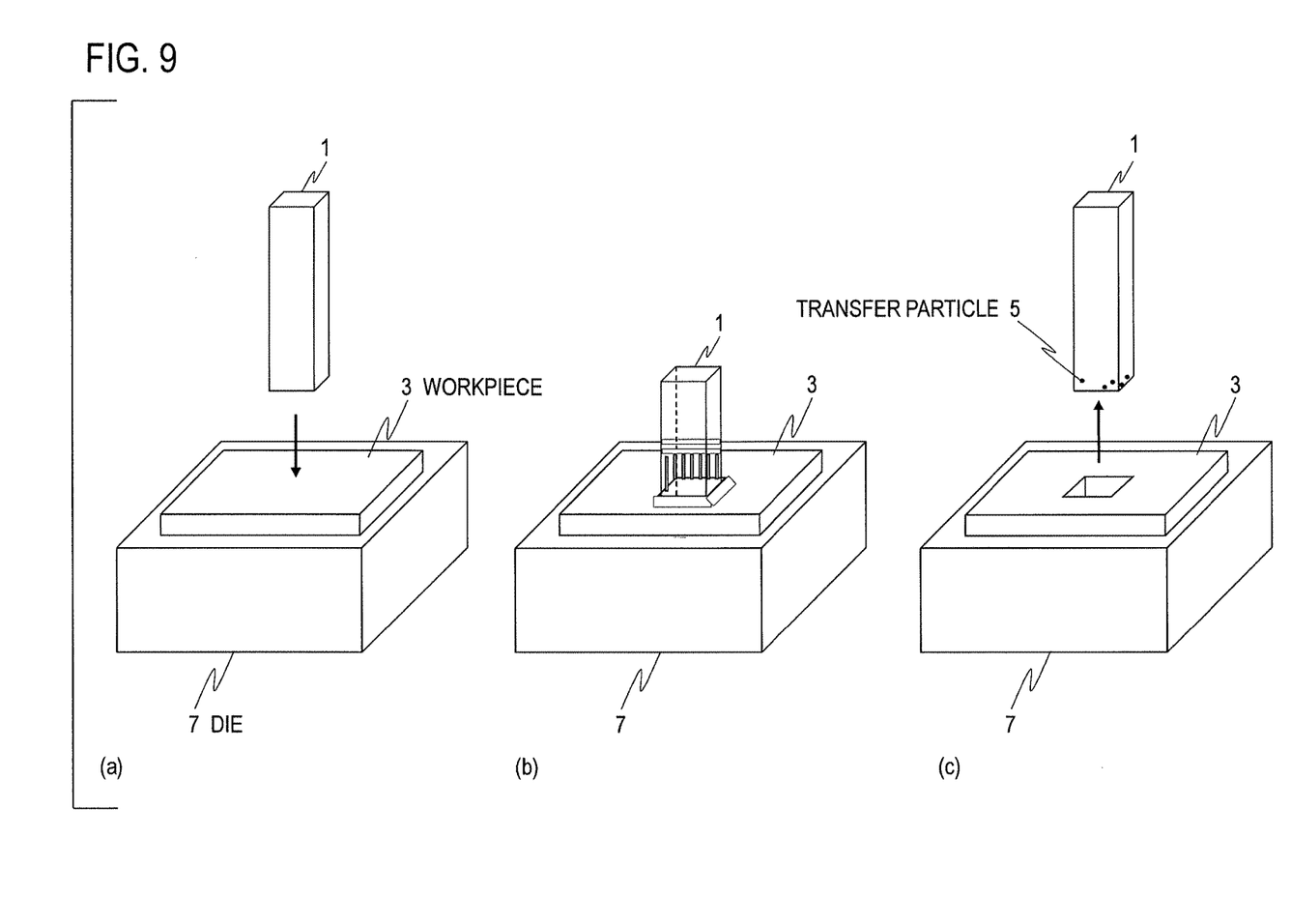
FIG. 9 shows a procedure of a sliding test performed in examples and comparative examples, specifically, an illustration (a) in FIG. 9 shows a step in which a workpiece is set in a certain position, an illustration (b) in FIG. 9 shows a step in which the punch mold is pounded into the workpiece, an illustration (c) in FIG. 9 shows a step in which the punch mold is pulled out of the workpiece.
Figure 10A:
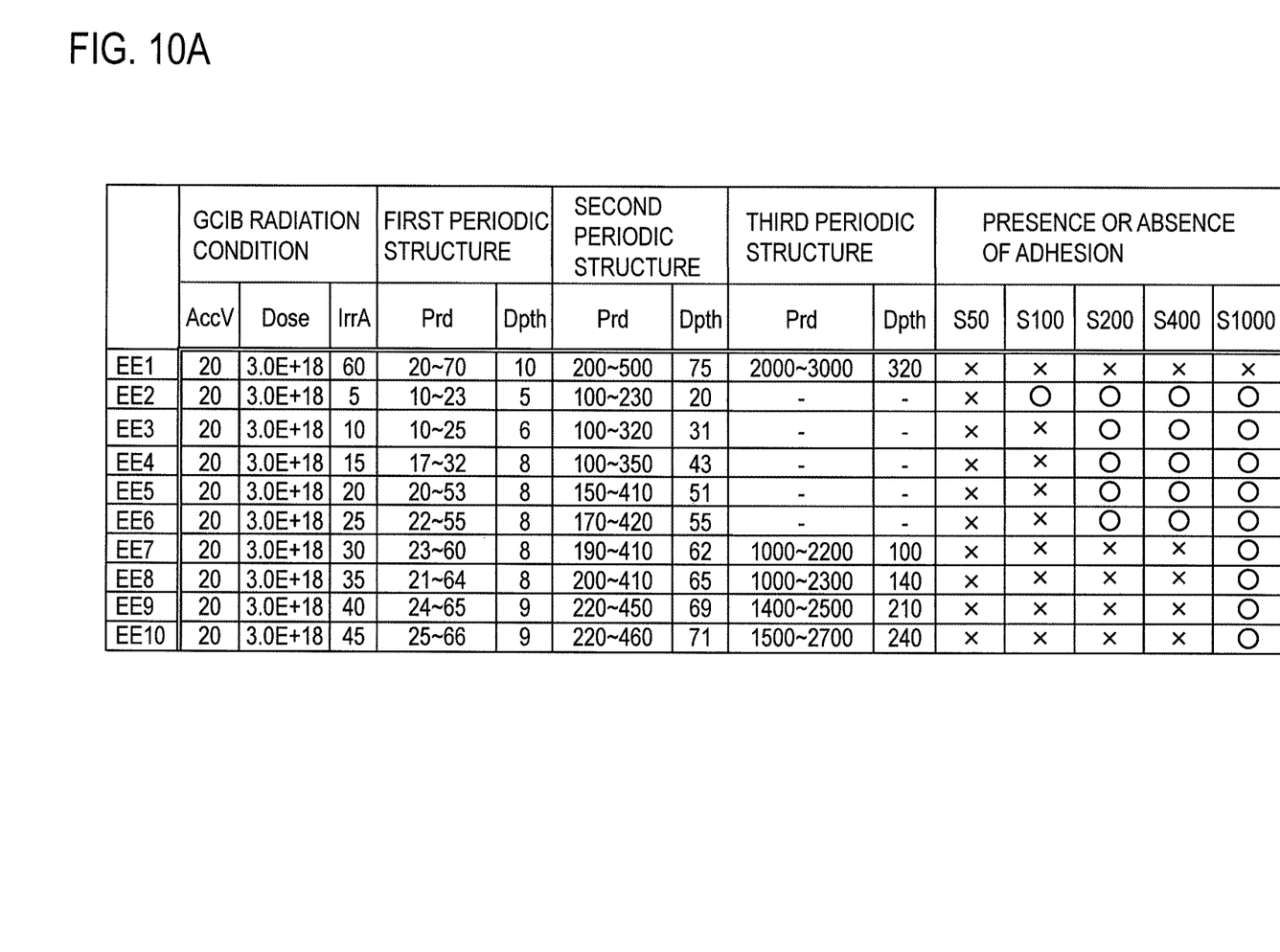
FIG. 10A lists the results of the sliding test performed in examples 1 to 10.
Figure 10B:
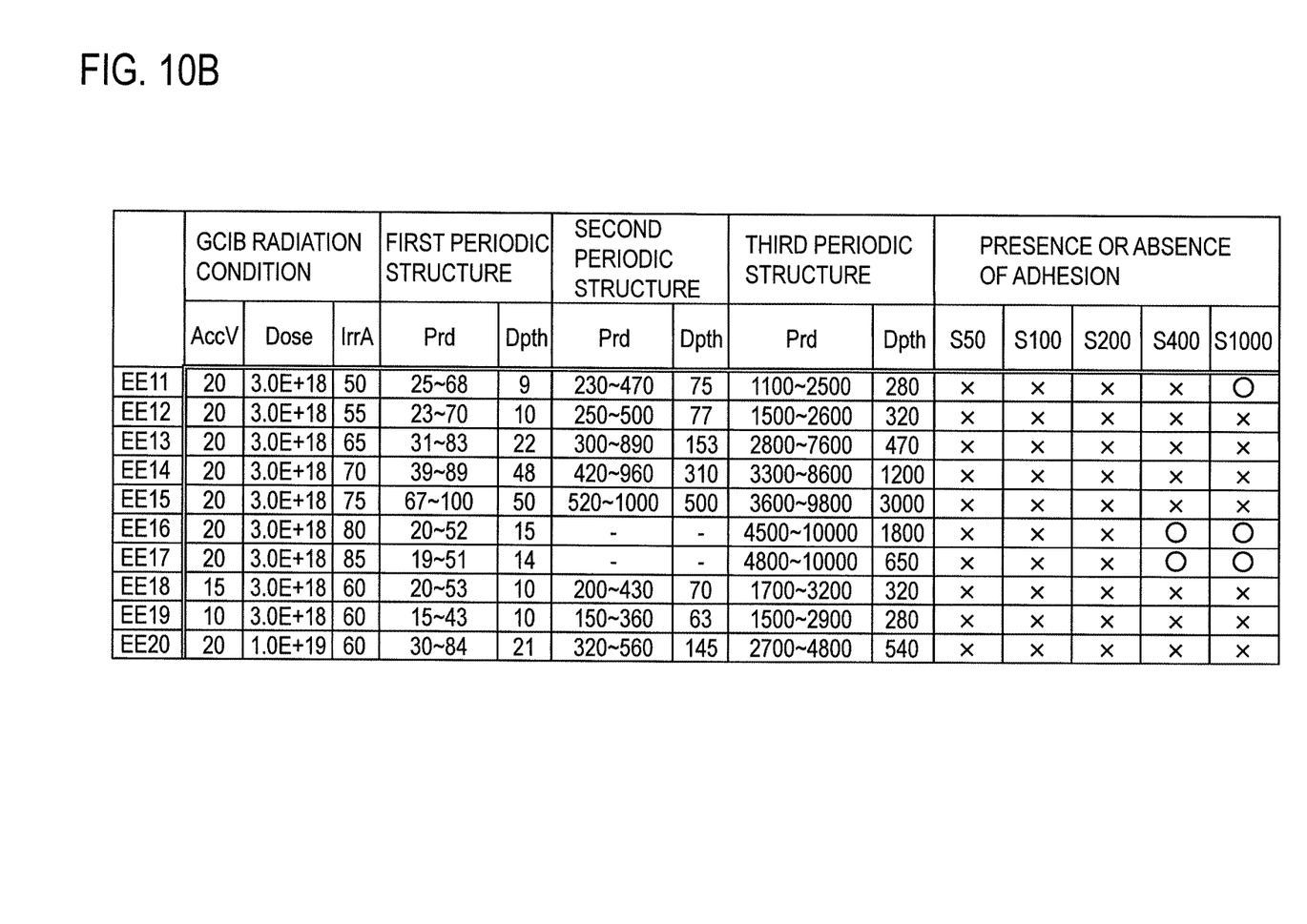
FIG. 10B lists the results of the sliding test performed in examples 11 to 20.
Figure 10C:
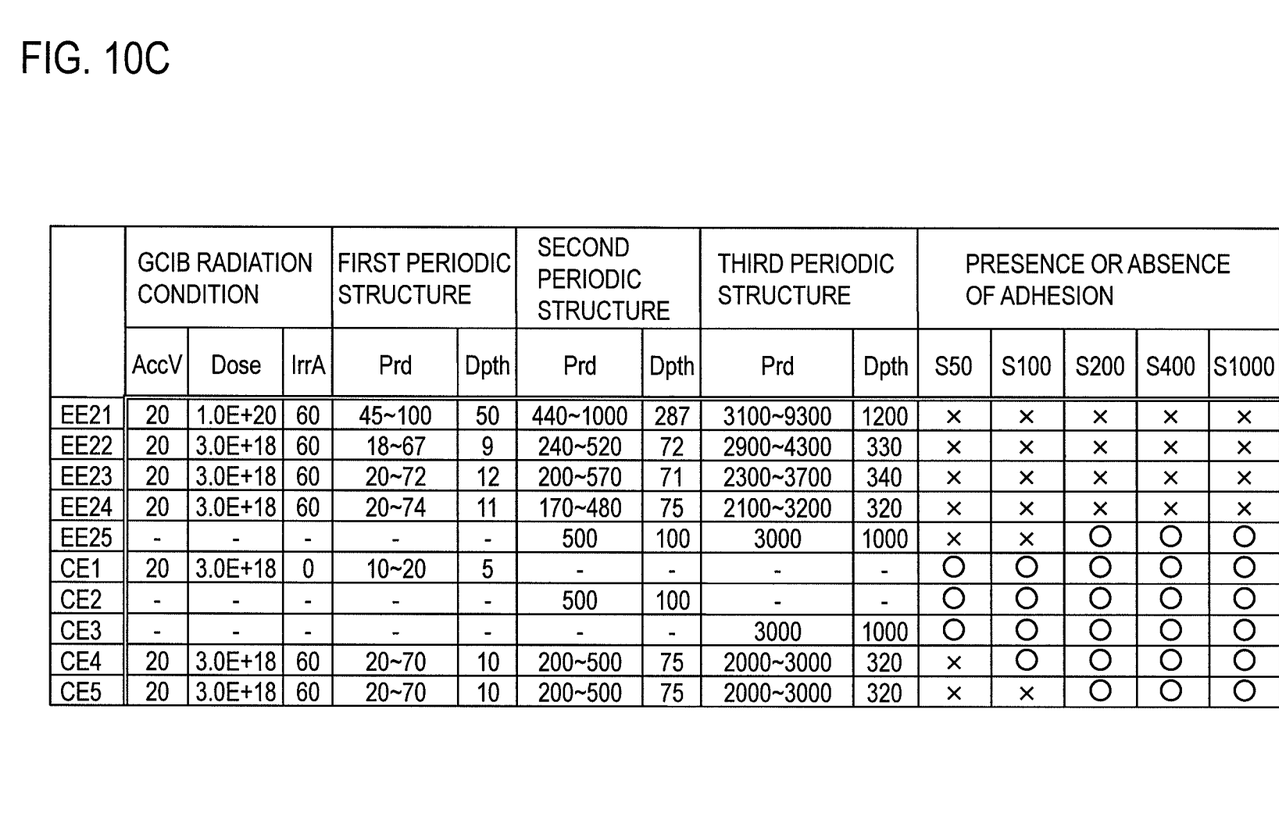
FIG. 10C lists the results of the sliding test performed in examples 21 to 25 and comparative examples.

A sliding test was performed, in which a stainless steel (Japanese Industrial Standards SUS304) plate with a thickness of 0.1 mm to which a lubricant (naphthene series mineral oil) was applied was punched by the punch mold that was set in a press machine (see FIG. 9). The stainless steel (Japanese Industrial Standards SUS304) plate is equivalent to the workpiece 3. Reference numeral 7 indicates a die. Whether a transfer particle 5 was present on a side wall of the punch mold was observed by the scanning electron microscope every hundred thousands of shots and the composition of the particle was analyzed by energy dispersive X-ray analysis. No transfer particle 5 from the workpiece 3 (stainless steel plate) was observed until at least ten million shots (see FIG. 10A). In FIGS. 10A to 10C, EE indicates an example; CE indicates a comparative example; AccV indicates an acceleration voltage (kV), Dose indicates a dose amount (ions/cm$^2$), IrrA indicates a radiation angle (degree); Prd indicates period (nm); Dpth indicates a depth (nm); S50 indicates five hundred thousand shots; S100 indicates one million shots; S200 indicates two million shots; S400 indicates four million shots; S1000 indicates ten million shots; symbol × indicates no generation of adhesion, and symbol ○ indicates occurrence of adhesion.

EXAMPLES 2 to 21

First to third periodic structures were formed on the surface of the punch mold by changing the radiation conditions of a gas cluster ion beam, and the same slide test as in example 1 was performed. The radiation conditions of the gas cluster ion beam, the periods and depths of the first to third periodic structures corresponding to the radiation conditions, and the presence or absence of a transfer particle 5 on the side wall of the punch mold are shown in FIGS. 10B and 10C.

In examples 1 to 17, the radiation angle of the gas cluster ion beam was changed.

In examples 1, 18, and 19, the acceleration voltage of the gas cluster ion beam was changed.

In examples 1, 20 and 21, the dose amount of the gas cluster ion beam was changed.

EXAMPLES 22 to 24

The material of the slide part was changed, but the other conditions were the same as in example 1. In example 22, the material of the punch mold was die steel SKD11 (Japanese Industrial Standards) and the material of the workpiece 3 was stainless steel SUS304 (Japanese Industrial Standards). In example 23, the material of the punch mold was die steel SKD11 (Japanese Industrial Standards) and the material of the workpiece 3 was phosphor bronze. In example 24, the material of the punch mold was superhard material (V20) and the material of the workpiece 3 was phosphor bronze. The same sliding test as in example 1 was performed. The radiation conditions of the gas cluster ion beam, the periods and depths of the first to third periodic structures corresponding to the radiation conditions, and the presence or absence of a transfer particle 5 on the side wall of the punch mold are shown in FIG. 10C.

EXAMPLE 25

A punch mold was created by grinding work. The material of the punch mold was superhard material (V20). The punch mold had a rectangular (1 mm×2 mm) bottom. A periodic structure was formed on a side of the punch mold by an ultraprecise five-axis working machine. The periodic structure is a line-and-space structure in which lines extend in a direction orthogonal to the slide direction. Then, the same slide test as in example 1 was performed. The periods and depths of the second and third periodic structures and the presence or absence of a transfer particle 5 on the side wall of the punch mold are shown in FIG. 10C.

COMPARATIVE EXAMPLE 1

The radiation angle of the gas cluster ion beam was set to 0 degrees, at which the radiation direction matches the direction of a line normal to the side of the punch mold. The other conditions were the same as in example 1. In this processing, only the first periodic structure was formed on the side of the punch mold and the same slide test as in example 1 was performed. The radiation conditions of the gas cluster ion beam, the period and depth of the first periodic structure corresponding to the radiation conditions, and the presence or absence of a transfer particle 5 on the side wall of the punch mold are shown in FIG. 10C.

COMPARATIVE EXAMPLE 2

Only the second periodic structure was formed on the side of the punch mold. The other conditions were the same as in example 25. The same slide test as in example 1 was performed. The period and depth of the second periodic structure and the presence or absence of a transfer particle 5 on the side wall of the punch mold are shown in FIG. 10C.

COMPARATIVE EXAMPLE 3

Only the third periodic structure was formed on the side of the punch mold. The other conditions were the same as in example 25. The same slide test as in example 1 was performed. The period and depth of the third periodic structure and the presence or absence of a transfer particle 5 on the side wall of the punch mold are shown in FIG. 10C.

COMPARATIVE EXAMPLE 4

A punch mold was created in the same conditions as in example 1 except that the radiation direction of the gas cluster ion bean was changed. The radiation direction of the gas cluster ion bean was changed so as to be parallel with the slide direction. The first to third periodic structures were formed so that the lines in the ripple structure, which were the second periodic structure, extended in a direction parallel with the slide direction. The same slide test as in example 1 was performed. The periods and depths of the first to third periodic structures and the presence or absence of a transfer particle 5 on the side wall of the punch mold are shown in FIG. 10C.

COMPARATIVE EXAMPLE 5

A punch mold was created in the same conditions as in example 1 except that the radiation direction of the gas cluster ion bean was changed. The radiation direction of the gas cluster ion bean was changed so that the angle formed by the radiation direction and the slide direction becomes 45 degrees. The first to third periodic structures were formed so that the angle formed by the line in the ripple structure, which were the second periodic structure, and the slide direction became 45 degrees. The same slide test as in example 1 was performed. The periods and depths of the first to third periodic structures and the presence or absence of a transfer particle 5 on the side wall of the punch mold are shown in FIG. 10C.

The results of examples 1 to 21 and comparative example 1, the following facts are found. When only the first periodic structure is formed, a transfer particle 5 adheres to the surface of the press mold even if the press count is as small as five hundred thousand shots. On the other hand, when at least two of the first, second, and third periodic structures are formed on the surface of the press mold, generation of a transfer particle 5 is significantly suppressed. When all of the first, second, and third periodic structures are formed as shown in examples 7 to 15, further significant effects can be obtained and no transfer particle 5 is generated until four million shots. It is sufficient to set the angle formed by the radiation direction of the gas cluster ion beam and the line normal to the side of the press mold to 30 degrees to 75 degrees inclusive in order to form all of the three periodic structures.

The results of examples 1 and 22 to 24 show that the effects of the present invention do not depend on the material of the slide part.

Consideration of example 25 and comparative examples 2 and 3 shows that no effects are obtained if only one of the three periodic structures is formed. At least two of the three periodic structures need to be formed on the punch mold to obtain effects.

Consideration of example 1 and comparative examples 4 and 5 shows that adhesion can be prevented if the slide part has a ripple structure in which lines extend in a direction substantially orthogonal to the slide direction of the slide part.

Besides the above examples, the gas cluster ion beam can also be radiated to ceramic or silicon materials to form at least two periodic structures for improvement of the sliding durability of the slide part. The present invention takes advantage of an essential phenomenon in which the gas cluster ion beam forms periodic structures such as ripples while flattening acute projections. Accordingly, it will be clear that various conditions such as the type of the gas cluster and acceleration energy, and the materials of the slide part and lubricant are not specially limited. In addition, the above surface structure does not need to be present on all slide areas and only needs to be present, for example, at an edge of the slide part.

In the above examples, as shown in FIG. 7(e), the first periodic structure and/or the second periodic structure were formed on a part of the third periodic structure that faces the slide part 1 when the slide part 1 (punch mold) was inserted into the workpiece 3. This is because the gas cluster ion beam was radiated to the side of the slide part 1 from only one direction; if the gas cluster ion beam is radiated from the opposite direction to this direction under appropriate radiation conditions, the first periodic structure and/or the second periodic structure can be formed on the back of the above part of the third periodic structure. In consideration of the fact that the friction resistance when the slide part 1 is inserted into the workpiece 3 is larger than that when the slide part 1 is pulled out of the workpiece 3, the first periodic structure and/or the second periodic structure are preferably formed on the above portion of the third periodic structure and the first periodic structure and/or the second periodic structure are preferably also formed on the back of the above portion of the third periodic structure. This is also true when the first periodic structure and the second periodic structure are formed on the surface of the slide part 1.

The foregoing description of the embodiments of the invention has been presented for the purpose of illustration and description. It is not intended to be exhaustive or to limit the invention to the precise form disclosed. Modifications or variations are possible in light of the above teachings. The embodiment was chosen and described to provide the illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of processing a surface of a slide part using a gas cluster ion beam, comprising: radiating the gas cluster ion beam to the surface of the slide part from a direction parallel to a slide direction of the slide part in order to form, on the surface of the slide part, a surface structure in which a first periodic structure with a period of 100 nm to 1000 nm inclusive and a depth of 20 nm to 500 nm inclusive is formed on a second periodic structure with a period of 1000 nm to 10000 nm inclusive and a depth of 100 nm to 3000 nm inclusive.

2. A method of processing a surface of a slide part using a gas cluster ion beam, comprising: radiating a gas cluster ion beam to the surface of the slide part from a direction parallel to a slide direction of the slide part; and radiating another gas cluster ion beam to the surface of the slide part from a direction opposite of the former direction in order to form, on the surface of the slide part, a surface structure in which a first periodic structure with a period of 100 nm to 1000 nm inclusive and a depth of 20 nm to 500 nm inclusive is formed on a second periodic structure with a period of 1000 nm to 10000 nm inclusive and a depth of 100 nm to 3000 nm inclusive.

3. A method of processing a surface of a slide part using a gas cluster ion beam, comprising: radiating the gas cluster ion beam to the surface of the slide part with an angle within a range of 30 degrees to 75 degrees inclusive, which is formed by the gas cluster ion beam to be radiated and a line normal to the surface of the slide part, in order to form, on the surface of the slide part, a surface structure in which a first periodic structure with a period of 100 nm to 1000 nm inclusive and a depth of 20 nm to 500 nm inclusive is formed on a second periodic structure with a period of 1000 nm to 10000 nm inclusive and a depth of 100 nm to 3000 nm inclusive.

4. A method of processing a surface of a slide part using a gas cluster ion beam, comprising: radiating the gas cluster ion beam to the surface of the slide part with an angle within a range of 30 degrees to 75 degrees inclusive, which is formed by the gas cluster ion beam to be radiated and a line normal to the surface of the slide part; and radiating another gas cluster ion beam to the surface of the slide part from a direction opposite of an irradiation direction of the former gas cluster ion beam, in order to form, on the surface of the slide part, a surface structure in which a first periodic structure with a period of 100 nm to 1000 nm inclusive and a depth of 20 nm to 500 nm inclusive is formed on a second periodic structure with a period of 1000 nm to 10000 nm inclusive and a depth of 100 nm to 3000 nm inclusive.

* * * * *